United States Patent
Lin et al.

(10) Patent No.: US 7,160,804 B2
(45) Date of Patent: Jan. 9, 2007

(54) METHOD OF FABRICATING MOS TRANSISTOR BY MILLISECOND ANNEAL

(75) Inventors: Shian-Jyh Lin, Chiayi Hsien (TW);
Sheng-Tsung Chen, Tainan (TW);
Neng-Tai Shih, Taipei (TW);
Chien-Chang Huang, Taipei (TW);
Chien-Jung Yang, Taoyuan (TW);
Yi-Jung Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 50 days.

(21) Appl. No.: 11/174,750

(22) Filed: Jul. 5, 2005

(65) Prior Publication Data

US 2006/0094178 A1 May 4, 2006

(30) Foreign Application Priority Data

Oct. 21, 2004 (TW) .............................. 93131965 A

(51) Int. Cl.
*H01L 21/4763* (2006.01)
(52) U.S. Cl. ............. 438/663; 257/E21.12; 257/21.454
(58) Field of Classification Search ................ 438/663; 257/E21.12, E21.454
See application file for complete search history.

(56) References Cited

U.S. PATENT DOCUMENTS

| 4,379,727 | A  | * | 4/1983  | Hansen et al. .............. 438/530 |
| 6,537,886 | B1 | * | 3/2003  | Lee ............................ 438/306 |
| 6,849,831 | B1 | * | 2/2005  | Timans et al. .............. 219/390 |
| 7,118,980 | B1 | * | 10/2006 | Jain ........................... 438/305 |
| 2005/0136604 | A1 | * | 6/2005  | Al-Bayati et al. .......... 438/301 |
| 2005/0136623 | A1 | * | 6/2005  | Tan et al. ................... 438/471 |
| 2005/0202656 | A1 | * | 9/2005  | Ito et al. .................... 438/514 |
| 2005/0260836 | A1 | * | 11/2005 | Chu et al. ................... 438/510 |
| 2006/0008964 | A1 | * | 1/2006  | Mineji ........................ 438/199 |
| 2006/0088969 | A1 | * | 4/2006  | Jain ........................... 438/305 |

* cited by examiner

*Primary Examiner*—Thao P. Le
(74) *Attorney, Agent, or Firm*—Quintero Law Office

(57) ABSTRACT

A method of fabricating a MOS transistor by millisecond annealing. A semiconductor substrate with a gate stack comprising a gate electrode overlying a gate dielectric layer on a top surface of a semiconductor substrate is provided. At least one implanting process is performed to form two doped regions on opposite sides of the gate electrode. Millisecond annealing activates dopants in the doped regions. The millisecond anneal includes rapid heating and rapid cooling within 1 to 50 milliseconds.

23 Claims, 3 Drawing Sheets

METHOD OF FABRICATING MOS TRANSISTOR BY MILLISECOND ANNEAL

CROSS-REFERENCE TO RELATED APPLICATION

This application claims the priority of Taiwan Patent Application No. TW93131965, filed Oct. 21, 2004, the contents of which are hereby incorporated herein by reference in their entirety.

BACKGROUND

The invention relates to a method of fabricating a MOS transistor, and more particularly, to a method of fabricating a MOS transistor using a millisecond anneal to activate dopants.

In semiconductor fabrication, dopants are often implanted in a semiconductor wafer to control a number of electric carriers and form a plurality of conductive doped regions in the semiconductor wafer to construct electric devices. Dopants are implanted by doping processes. Typically, after doping, such as by ion implantation, thermal diffusion, or chemical evaporation, forms a doped region in a semiconductor substrate, a thermal process then repairs damage caused by the doping process and activates dopants in the substrate to reduce resistance of the doped regions.

During thermal process, dopants diffuse outward from the designable doped region since the dopant concentration of the designable doped region is higher than that of the semiconductor substrate. As duration of the thermal process increases, diffusion distance of dopants, leading to obvious changes in shape, location, and dopant concentration. Some semiconductor technologies drive dopants into a semiconductor substrate deeply or enlarge the doped region in this manner.

As semiconductor devices are scaled down and integration thereof increases, precise control of the doped region is needed. Thus, duration of the thermal process is reduced significantly. For example, a conventional thermal process may take 20 to 30 minutes. Current thermal process, such as rapid thermal annealing (RTA) or rapid thermal process (RTP), can typically take one minute. For laser annealing, the duration is only several nanoseconds. Since the RTP or RTA has a high temperature ramp up rate and short duration, a shallow diffusion depth can be achieved, reducing junction depth and diffusion in lateral directions and avoiding short channel effect and threshold voltage shift, associated with conventional process. However, when the device generation is nanometer scale, particularly less than 60 nm, RTA remains unable to completely satisfy the requirements of junction activation or device performance.

SUMMARY

Embodiments of a method of fabricating a MOS transistor comprise providing a substrate having a predetermined channel region in the substrate surface. A first ion implantation process is performed on the substrate surface to implant first dopants into a predetermined channel region. A gate stack comprising a gate dielectric layer and a gate electrode is formed in the predetermined channel region. A second ion implantation process is performed on the substrate to implant second dopants into two sides of the gate stack and form two doped regions adjacent to both sides of the gate stack. The doped regions serve as a source and a drain of the MOS transistor. Thereafter, a millisecond annealing process comprising rapid heating and rapid cooling is performed, both having duration of 1 to 50 milliseconds.

Further provided is a method of activating dopants. A substrate having at least one doped region is provided. A millisecond annealing process comprising rapid heating and rapid cooling is then performed to activate dopants in the substrate, both having duration of 1 to 50 milliseconds.

DESCRIPTION OF THE DRAWINGS

The invention can be more fully understood by reading the subsequent detailed description and examples with references made to the accompanying drawings, wherein.

DETAILED DESCRIPTION

Figure 1:
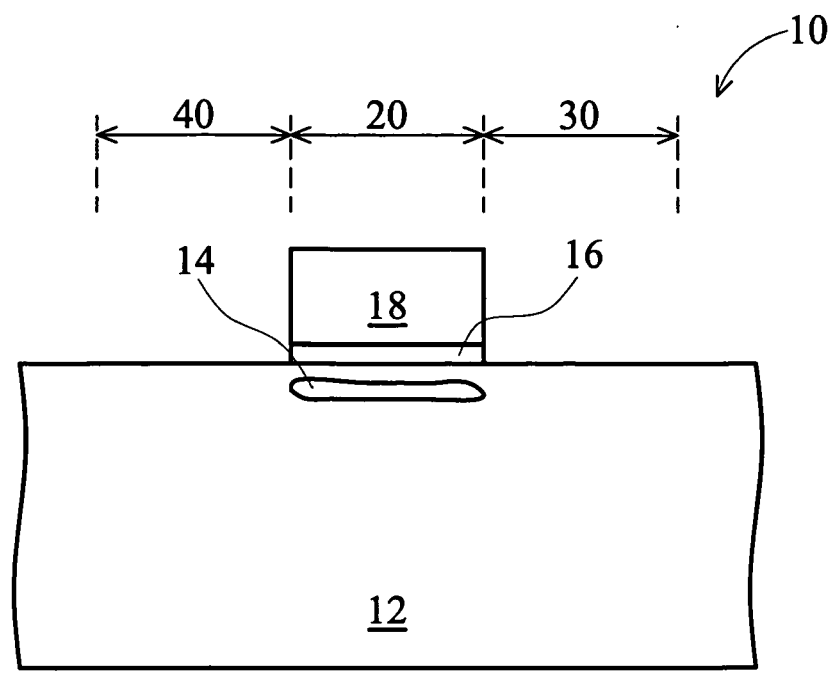
FIG. 1 and FIG. 2 are schematic diagrams of an embodiment of a method of fabricating a MOS transistor.
Figure 2:
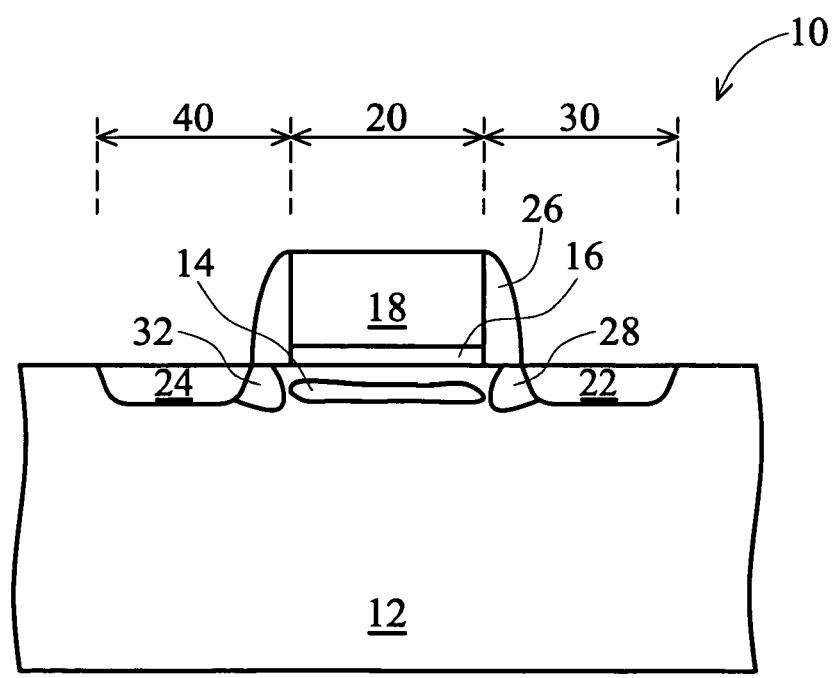

FIGS. 1 and 2 are schematic diagrams of embodiments of a method of fabricating a MOS transistor. As shown in FIG. 1, a semiconductor wafer 10 is provided, comprising a semiconductor substrate 12 with a well 13 comprising a source region 30, a drain region 40, and a channel region 20 disposed thereon. A first ion implantation with proper masks forms a first doped region 14, adjusting a threshold voltage of a subsequent metal-oxide semiconductor (MOS) transistor. A gate dielectric layer 16 and a gate electrode 18 are formed on the channel region 20 of the semiconductor substrate 12 in sequence to form a gate stack. The gate dielectric layer 16, while here silicon oxide, can comprise other dielectric materials such as silicon nitride, silicon oxynitride, high-k dielectric materials or combinations thereof. The gate electrode 18 comprises a conductive material, preferably a polysilicon or doped polysilicon layer. In another embodiment of the invention, the gate electrode 20 comprises a doped polysilicon layer with a metal gate on top. The metal gate could be formed of Ti, TiN, W, WN, or combinations thereof.

As shown in FIG. 2, a second ion implantation process is performed by using the gate electrode 18 as a mask to form two first light doped drain (LDD) regions 28 adjacent to the gate oxide 16. Then, two first spacers 25 are formed adjacent to both sidewalls of the gate electrode 18 and the gate oxide 16. A third ion implantation process is performed by using the gate electrode 18 and the first spacers 25 as masks to form two second LDD regions 32 adjacent to the first LDD regions 28. Two second spacers 26 are then formed adjacent to the first spacers 25. A fourth ion implantation process is then performed to form heavily doped regions 22 and 24 served as source and drain respectively.

Dosage and operating parameters of the these ion implantation processes, obvious to one skilled in the art and not directly related to key features of the invention, are not described in detail.

Figure 3:
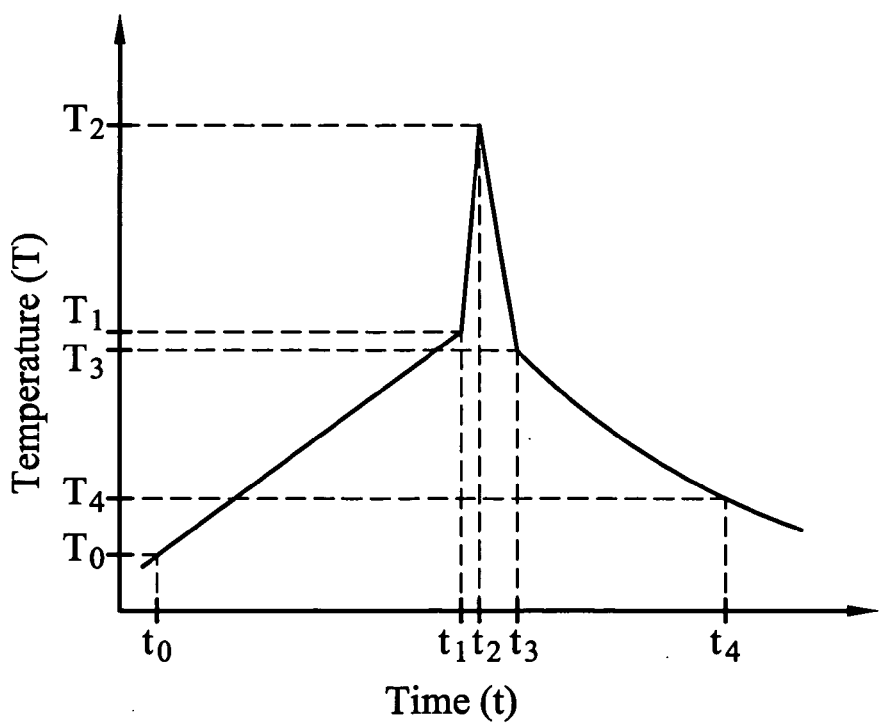
FIG. 3 is a schematic diagram showing the relationship between temperature and time in a thermal process used in embodiments of a method of fabricating a MOS transistor.

Thermal process is performed to activate dopants in the semiconductor substrate 12 to form the source/drain and to adjust the threshold voltage of the MOS transistor. FIG. 3 is a schematic diagram showing the relationship between temperature and time in a thermal process used in embodiments of a method of fabricating a MOS transistor. As shown, the semiconductor substrate 12 surface has an initial temperature T0 at time t0, having undergone prior heating process ramping up at 100 to 200° C. per second. The semiconductor substrate 12 surface reaches a first temperature T1 at time t1. Millisecond annealing is then performed, comprising rapid heating and rapid cooling. In rapid heating, the top surface of the semiconductor substrate 12 is heated at a ramping up rate exceeding 200° C. per second, preferably exceeding 50° C. per millisecond. The top surface of the semiconductor substrate 12 reaches a second temperature T2 at time t2. In rapid cooling, the top surface of the semiconductor substrate 12 is cooled at a ramping down rate exceeding 20° C. per millisecond. The top surface of the semiconductor substrate 12 reaches a third temperature T3 at time t3. An additional cooling process may be further performed to cool the surface of the semiconductor substrate 12 to a fourth temperature T4.

The initial temperature T0 and the fourth temperature T4 may both be room temperature, the first temperature T1 about 500 to 800° C., the second temperature T2 about 800 to 1500° C., and the third temperature T3 about 500 to 800° C. The rapid heating step has duration (t2–t1) of 1 to 50 milliseconds and the rapid cooling step has duration (t3–t2) of 1 to 50 milliseconds.

Figure 4:
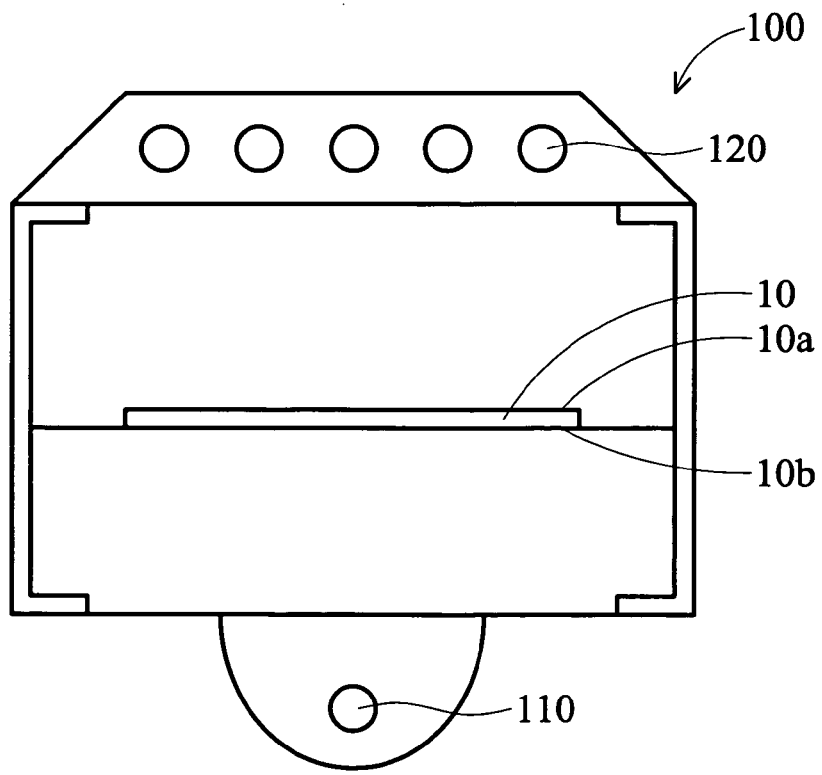
FIG. 4 is a schematic diagram of a heating device used in the thermal process of FIG. 3.

FIG. 4 is a schematic diagram of an embodiment of a heating device 100 used in the thermal process of FIG. 3. As shown, the heating device 100 comprises a container for a semiconductor wafer 10, a first heating source 110 above the container, and a second heating source beneath the container. The first heating source 110 and the second heating source are both arc lamps. The second heating source may comprise an argon lamp or a xenon lamp radiating light with a wavelength less than 1200 nm, the wavelength of the light absorbed by silicon.

When the semiconductor wafer 10 is placed in the heating device 100, the first heating source 110 heats the semiconductor wafer 10 from a bottom surface 10b thereof to temperature T1 at time t1.

At the millisecond annealing process, the second heating source 120 heats a top surface 10a of the semiconductor wafer 10, comprising the semiconductor substrate 12 having doped regions. The top surface 10a of the semiconductor wafer 10 is rapidly heated to temperature T2 at time t2. The second heating source 120 is turned off immediately and the top surface 10a rapidly cooled to the third temperature T3 at time t3, providing sufficient energy to activate dopants in the semiconductor substrate 12. The first heating source 110 is turned off to gradually cool the semiconductor wafer 10 to the fourth temperature T4 at time t4.

Figure 5:
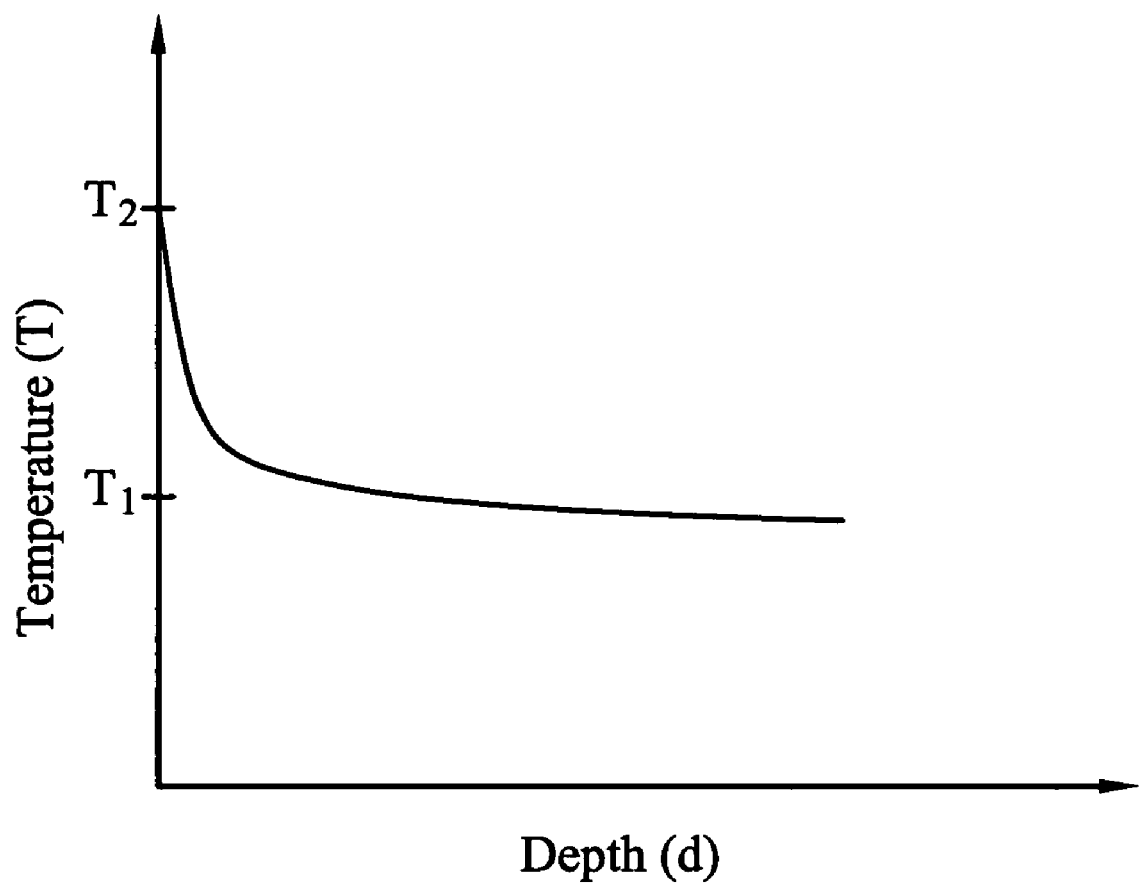
FIG. 5 is a schematic diagram showing the relationship between temperature and depth in the thermal process of FIG. 3.

FIG. 5 is a schematic diagram showing the relationship between temperature and depth in a thermal process of FIG. 3. As shown, although the top surface 10a of the semiconductor wafer 10 is heated to the second temperature T2 in the millisecond annealing process, only a portion of the semiconductor wafer 10 is heated to the second temperature T2. Most of the semiconductor wafer 10 is still at first temperature T1.

In comparison with the related art, the invention utilizes a millisecond annealing process to activate the dopants. Since the duration of the annealing process is less than $10^2$ milliseconds, dopant diffusion into the substrate 12 can be avoided and the thermal budget of the thermal process can be reduced effectively. In addition, the extremely high temperature gradient has great ability of activating the dopants, leading to reduce sheet resistance thereby. Furthermore, according to the excellent activating ability of the present invention, the dopant concentration of the ion implantation processes can be far reduced while the conductivity in the doped regions remain the same or even better. It leads to shallow doped regions and less damage during the ion implantation processes, reducing junction leakage of a MOS transistor and threshold voltage roll-off performance, and improving stability and reliability of semiconductor devices.

While the invention has been described by way of example and in terms of preferred embodiment, it is to be understood that the invention is not limited thereto.

What is claimed is:

1. A method of fabricating a metal-oxide semiconductor (MOS) transistor, comprising:
   providing a substrate having a predetermined channel region in the surface thereof;
   performing a first ion implantation process on the substrate surface to implant a plurality of first dopants into the predetermined channel region;
   forming a gate stack on the predetermined channel region, the gate stack comprising a gate dielectric layer and a gate electrode;
   performing a second ion implantation process on the substrate to implant second dopants into two sides of the gate stack and form two heavily doped regions adjacent to both sides of the gate stack, the heavily doped regions serving as a source and a drain of the MOS transistor; and
   performing a millisecond annealing process comprising rapid heating and rapid cooling, each having duration of 1 to 50 milliseconds.

2. The method as claimed in claim 1 wherein the millisecond annealing process repairs substrate damage for the first and second ion implantation processes and activates first dopants and second dopants.

3. The method as claimed in claim 1 wherein rapid heating heats a top surface of the substrate at a ramping up rate exceeding 50° C. per millisecond.

4. The method as claimed in claim 1 wherein rapid cooling cools a top surface of the substrate at a ramping down rate exceeding 20° C. per millisecond.

5. The method as claimed in claim 1 wherein the substrate comprises a well.

6. The method as claimed in claim 1 wherein the millisecond annealing process has duration of 1 to 50 milliseconds.

7. The method as claimed in claim 1 further comprising prior heating to heat the substrate to a first temperature before the millisecond annealing process is performed.

8. The method as claimed in claim 7 wherein the first temperature is about 500 to 800° C.

9. The method as claimed in claim 1 wherein the millisecond annealing process heats the surface of the substrate to a second temperature using rapid heating and cools the surface of the substrate to a third temperature using rapid cooling.

10. The method as claimed in claim 9 wherein the first temperature is about 800 to 1500° C.

11. The method as claimed in claim 9 wherein the first temperature is about 500 to 800° C.

12. The method as claimed in claim 1 further comprising forming two first light doped drain regions between the channel region and the heavily doped regions.

13. The method as claimed in claim 12 further comprising forming two second light doped drain regions between the first light doped drain regions and the heavily doped regions.

14. A method of activating dopants, comprising:
providing a substrate having at least one doped region; and
performing a millisecond annealing process comprising rapid heating and rapid cooling, each having duration of 1 to 50 milliseconds.

15. The method as claimed in claim 14 further comprising prior heating to heat the substrate to a first temperature before the millisecond annealing process is performed.

16. The method as claimed in claim 15 wherein after prior heating is performed, the millisecond annealing process heats the surface of the substrate to second temperature using rapid heating and cools the surface of the substrate to third temperature using rapid cooling.

17. The method as claimed in claim 16 wherein the first temperature is about 500 to 800° C.

18. The method as claimed in claim 16 wherein the second temperature is about 800 to 1500° C.

19. The method as claimed in claim 16 wherein the third temperature is about 500 to 800° C.

20. The method as claimed in claim 14 further comprising another cooling process to cool the substrate to room temperature after the millisecond annealing process is performed.

21. The method as claimed in claim 14 wherein the millisecond annealing process has duration of 1 to 50 milliseconds.

22. The method as claimed in claim 14 wherein rapid heating heats a top surface of the substrate at a ramping up rate over 50° C. per millisecond.

23. The method as claimed in claim 14 wherein rapid cooling cools a top surface of the substrate at a ramping down rate over 20° C. per millisecond.

* * * * *